May 3, 1966 W. C. ANDERSON ETAL 3,249,886

FREQUENCY MULTIPLYING SYNCHRONOUS OSCILLATOR CONTROLLED BY TIME OVERLAP BETWEEN SYNCHRONOUS PULSES AND THE OSCILLATOR OUTPUT

Filed Nov. 27, 1963

5 Sheets-Sheet 1

INVENTORS.
WILMER C. ANDERSON
DAVID E. EARLS
LEON NAJMAN
BY
ATTORNEY.

May 3, 1966 W. C. ANDERSON ETAL 3,249,886

FREQUENCY MULTIPLYING SYNCHRONOUS OSCILLATOR CONTROLLED BY TIME OVERLAP BETWEEN SYNCHRONOUS PULSES AND THE OSCILLATOR OUTPUT

Filed Nov. 27, 1963 5 Sheets-Sheet 2

INVENTORS.
WILMER C. ANDERSON
DAVID E. EARLS
LEON NAJMAN

BY [signature]
ATTORNEY.

May 3, 1966 W. C. ANDERSON ETAL 3,249,886

FREQUENCY MULTIPLYING SYNCHRONOUS OSCILLATOR CONTROLLED BY TIME OVERLAP BETWEEN SYNCHRONOUS PULSES AND THE OSCILLATOR OUTPUT

Filed Nov. 27, 1963 5 Sheets-Sheet 3

SYNC SIGNAL INPUT

INVENTORS.
WILMER C. ANDERSON
DAVID E. EARLS
LEON NAJMAN
BY
ATTORNEY.

FREQUENCY MULTIPLYING SYNCHRONOUS OSCILLATOR CONTROLLED BY TIME OVERLAP BETWEEN SYNCHRONOUS PULSES AND THE OSCILLATOR OUTPUT

Filed Nov. 27, 1963

INVENTORS.
WILMER C. ANDERSON
DAVID E. EARLS
LEON NAJMAN
BY
ATTORNEY.

May 3, 1966 W. C. ANDERSON ETAL 3,249,886

FREQUENCY MULTIPLYING SYNCHRONOUS OSCILLATOR CONTROLLED BY TIME OVERLAP BETWEEN SYNCHRONOUS PULSES AND THE OSCILLATOR OUTPUT

Filed Nov. 27, 1963 5 Sheets-Sheet 5

INVENTORS.
WILMER C. ANDERSON
DAVID E. EARLS
BY LEON NAJMAN

ATTORNEY.

United States Patent Office 3,249,886

Patented May 3, 1966

3,249,886

FREQUENCY MULTIPLYING SYNCHRONOUS OSCILLATOR CONTROLLED BY TIME OVERLAP BETWEEN SYNCHRONOUS PULSES AND THE OSCILLATOR OUTPUT

Wilmer C. Anderson, Greenwich, David E. Earls, Norwalk, and Leon Najman, South Norwalk, Conn., assignors to General Time Corporation, New York, N.Y., a corporation of Delaware Filed Nov. 27, 1963, Ser. No. 326,422

1 Claim. (Cl. 331—11)

The present invention relates to a frequency multiplying synchronous oscillator and more specificially to circuitry including an oscillator for producing an output signal having a frequency which is an exact multiple of an input signal frequency.

An object of the present invention is to provide a novel frequency multiplying synchronous oscillator which is extremely simple, but which enables high multiplication ratios, on the order of 500:1, to be achieved. Another object is to provide a frequency multiplying synchronous oscillator which is automatically adjusted to oscillate at a frequency which is a certain desired multiple of an input signal frequency. Still another object is to provide such an oscillator which is capable of high multiplication ratios, but which is relatively insensitive to the magnitude or wave shape of the input signal.

An additional object of this invention is to provide a frequency multiplying synchronous oscillator capable of operating at a high multiplication ratio, but which may be simply and compactly constructed using a small number of readily available parts and which produces a stable and reliable output even in the face of wide swings in ambient temperature. In this connection, an object is to provide such an oscillator characterized in its high "repeatability."

Still another object is to provide a frequency multiplying synchronous oscillator which may be employed as a building block in more complex control, communication and computing systems for remote unattended operation and where the highest order of reliability is essential.

Other objects and advantages of the present invention will become apparent upon reading the attached detailed description and upon reference to the drawings, in which.

While the invention has been described in connection with certain preferred embodiments, it is to be understood that the invention is not to be limited to the disclosed embodiments but, on the contrary, the invention is intended to cover the various modifications and equivalent arrangements included within the spirit and scope of the appended claim.

Figures 1, 4:
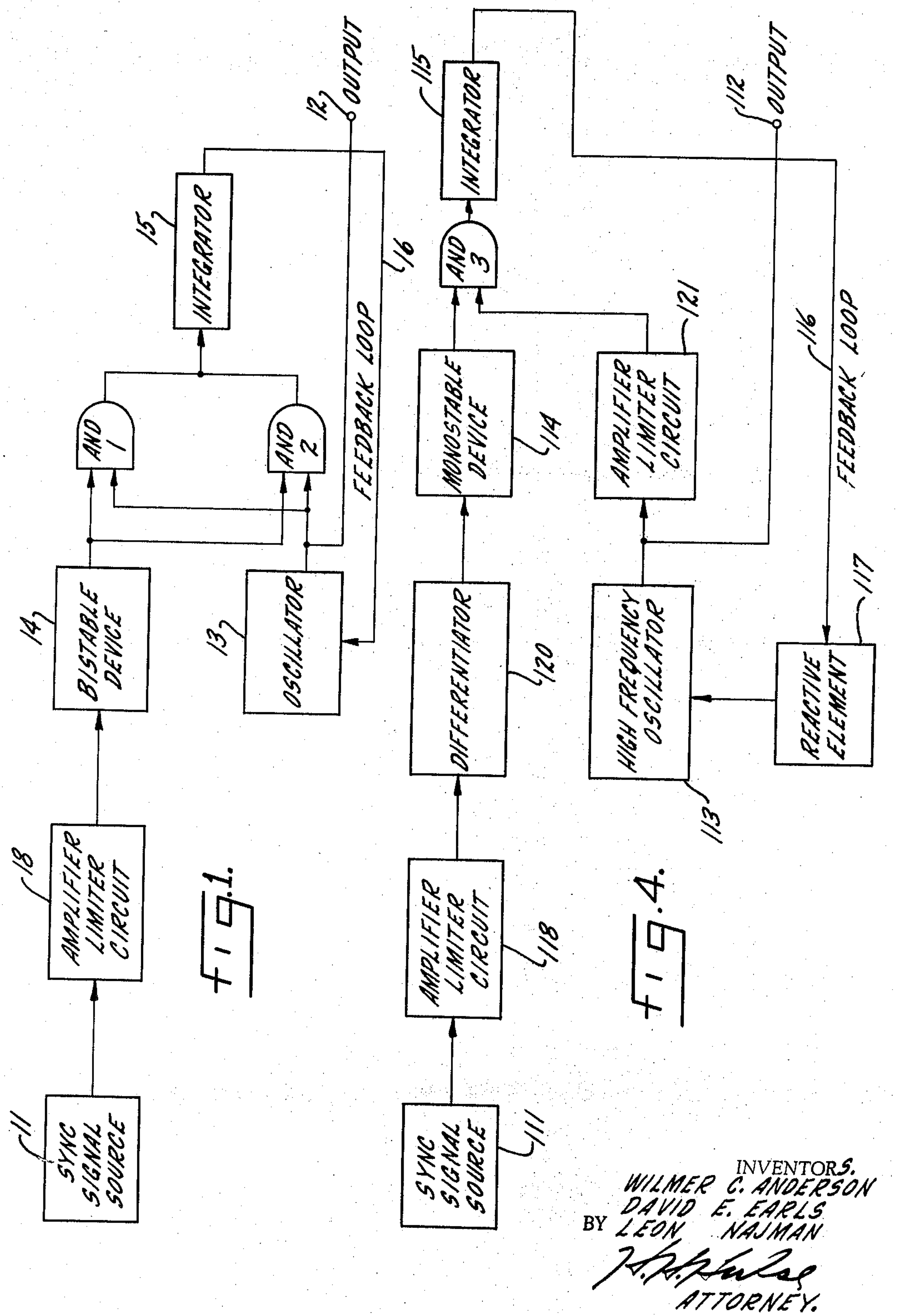
FIGURE 1 is a block diagram illustrating a first embodiment of a frequency multiplying synchronous oscillator constructed in accordance with the present invention.
FIG. 4 is a block diagram illustrating a second embodiment of a frequency multiplying synchronous oscillator constructed in accordance with the present invention.

Referring to FIG. 1, a first embodiment of a frequency multiplying synchronous oscillator is illustrated which includes a synchronous signal source 11. The synchronous signal source is provided for producing a desired input signal having a frequency which is to be multiplied so that a desired output signal is provided at an output terminal 12. In accordance with the present invention, means are provided for producing an output signal at the output terminal 12 which has a frequency that is maintained at an exact multiple of the synchronous signal frequency. More specifically, means are provided for regulating the output frequency of an oscillator 13, which has its output connected to the output terminal 12, in accordance with the frequency of the synchronous signal source so that an output signal having a desired frequency is provided thereby.

For this purpose, a bistable control device 14 is provided for producing an output pulse of a first polarity having a predetermined volt-second content in response to the first half of each synchronous signal cycle and for producing an output pulse of the opposite polarity having the same volt-second content in response to the second half of each synchronous signal cycle. Additionally, an integrator 15 is associated with the outputs of the bistable device 14 and the oscillator 13 and produces a control signal in response to pulses of the same polarity from the bistable device and the oscillator timingly overlapping, i.e., portions of the pulses being concurrently provided. As will become apparent, the control signal has an amplitude determined by the duration of overlap and the frequency of overlap and is transmitted to the oscillator 13 over a feedback loop 16 to control the output frequency of the oscillator, the instantaneous oscillator frequency being determined by the instantaneous amplitude of the control signal and the oscillator frequency being at the desired level when an equilibruim amplitude of the control signal is maintained.

For the purpose of controlling the operation of the integrator 15 in response to pulses from the bistable device and the oscillator timingly overlapping, a pair of gates AND 1 and AND 2 are interposed between the integrator and both the bistable device and the oscillator. Each gate has a pair of input terminals which are respectively connected to the outputs of the bistable device and the oscillator and has an output terminal connected to the integrator input so that the gate is opened and a pulse is applied to the integrator when pulses of a prescribed polarity are concurrently applied to the input terminals, i.e., the pulses timingly overlap. Since the time interval during which a gate is open is determined by the duration of overlap of the pulses provided by the bistable device and the oscillator, the time duration of the pulses applied to the integrator and thus the magnitude (i.e., the volt-second integral) thereof are likewise determined thereby. The integrator 15 integrates the pulses applied thereto and, accordingly, the amplitude of the control signal produced thereby is determined by the magnitude of the pulses applied thereto and the frequency at which such pulses are provided, the output of the integrator being substantially equal to the average value of the input applied thereto.

In the present instance, let it be assumed that the gate

AND 1 is designed to cause a positive polarity pulse to be applied to the integrator when positive output pulses are concurrently produced by the bistable device and the oscillator. Conversely, let it be assumed that gate AND 2 is designed to cause a positive input pulse to be applied to the integrator when negative output pulses are concurrently produced by the bistable device and the oscillator.

As may be seen, an amplifier-limiter circuit 18 has been connected between the output of the synchronous signal source 11 and the input of the bistable device 14. The amplifier-limiter circuit has been provided to produce an essentially square wave output signal in response to the receipt of a sine wave input signal so that the bistable device 14 responds more accurately thereto. It follows that, with the amplifier-limiter circuit, the synchronous signal source may be a standard sine wave generator. However, it is to be understood that the invention is not intended to be limited to the inclusion of an amplifier-limiter circuit, but rather is intended to include any desired modification falling within the scope of the appended claims. For example, the synchronous signal source 11 itself may be designed to be a square wave generator or the bistable device may be designed to respond to a sine wave input.

Figure 2:
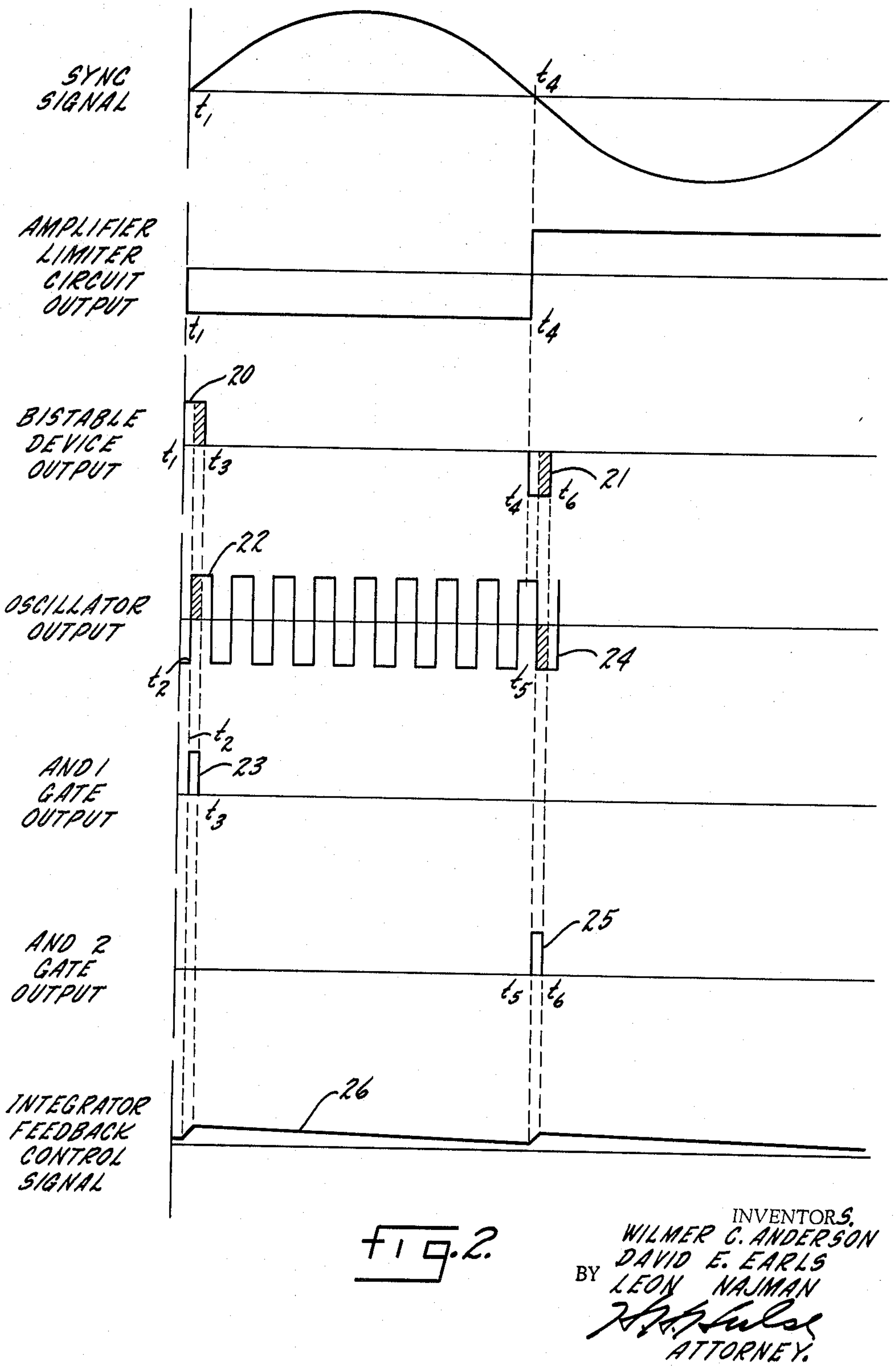
FIG. 2 illustrates typical wave forms at preselected positions in the oscillator arrangement illustrated in FIG. 1.

A brief discussion of the operation of the frequency multiplier in FIG. 1 in conjunction with the graphs illustrated in FIG. 2 may be helpful in providing a better understanding of the operation of the present invention. Referring to FIG. 2, it may be seen that a sine wave output signal is produced by the synchronous signal source. As will become apparent later, a negative-going square wave signal is produced by the amplifier-limiter circuit 18 in response to each positive-going half cycle of the sine wave signal and, conversely, a positive-going square wave signal is produced in response to each negative-going half cycle of the sine wave signal. Accordingly, as may be seen in FIG. 2, the output of the amplifier-limiter circuit is negative going at time $t_1$ and is positive going at time $t_4$. The bistable device 14 responds to the negative-going output at time $t_1$ to produce a positive-going output pulse 20 from time $t_1$ to time $t_3$ and responds to the positive-going output at time $t_4$ to produce a negative-going output pulse 21 from time $t_4$ to time $t_6$.

As may be seen, a continuously alternating, pulse-type output is produced by the oscillator and, at time $t_2$, a positive-going pulse 22 is produced thereby so that from time $t_2$ to time $t_3$ positive-going outputs are concurrently provided by the bistable device and the oscillator. Accordingly, during this time period, the gate AND 1 is open and a positive pulse 23 is transmitted therethrough to the integrator 15. At time $t_5$, a negative-going output pulse 24 is produced by the oscillator and, as may be seen, negative outputs are concurrently produced by the bistable device and the oscillator from time $t_5$ to time $t_6$. Accordingly, during this time period, the gate AND 2 is open and a positive pulse 25 is transmitted therethrough to the integrator. The integrator integrates the input pulses applied thereto so that a control signal 26, such as that illustrated in FIG. 2 wherein it takes the form of a slowly varying D.-C. signal, is applied to the oscillator to control the output frequency thereof. The amplitude of the control signal is determined by the time duration and frequency at which pulses are applied to the integrator through the gates AND 1 and AND 2 and thus corresponds approximately to the average of the input applied thereto.

It should be noted that, when no change in overlapping occurs between output pulses from the bistable device and the oscillator, it indicates the oscillator frequency is a desired multiple of the synchronous signal frequency and a constant feedback control signal will be produced. Conversely, when a change in overlapping occurs, it indicates the oscillator frequency is not a desired multiple of the synchronous signal frequency and the feedback control signal will be changed to alter the oscillator frequency accordingly. Preferably, the time period of the output pulses provided by the bistable device corresponds to the time period for each half cycle of the oscillator so that the time periods of the pulses transmitted through the gates may vary between zero time period and a maximum time period corresponding to the time period for each half cycle of the oscillator output, the actual time period depending upon the period of overlap.

Figure 3:
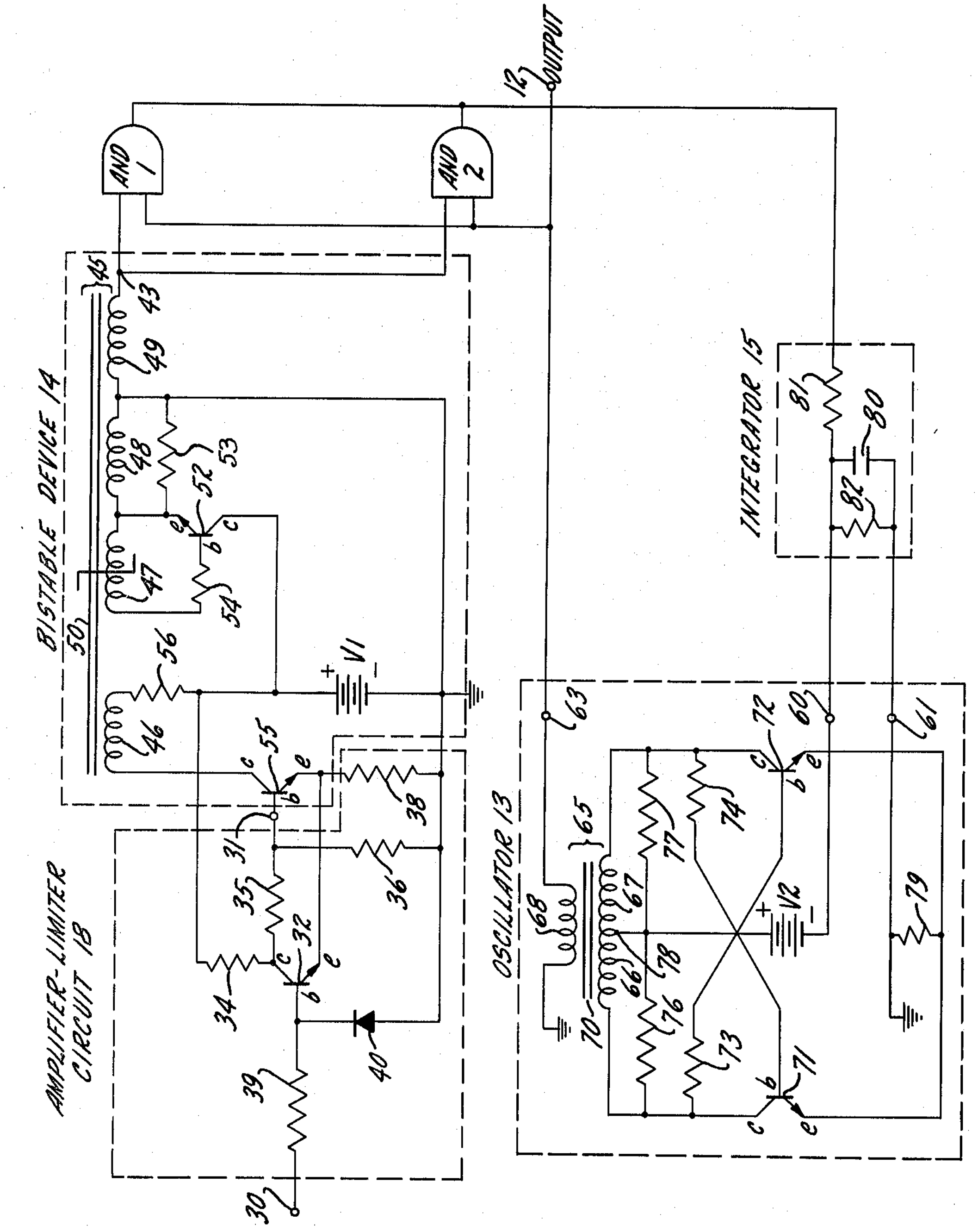
FIG. 3 is a schematic diagram of the frequency multiplying synchronous oscillator illustrated in block form in FIG. 1.

In order to provide a better understanding of the operation of the above-described components, a detailed description thereof may be helpful. Referring to FIG. 3, the amplifier-limiter circuit 18, the bistable device 14, the oscillator 13 and the integrator 15 illustrated in block form in FIG. 1 are illustrated in schematic form. The amplifier-limiter circuit 18 has an input terminal 30 to which the synchronous signal is applied and has an output terminal 31 corresponding to the input terminal of the bistable device 14. The amplifier-limiter circuit includes a transistor 32 having a base, an emitter and a collector, respectively designated as *b*, *e* and *c*, for controlling the output produced thereby. The collector is connected to the positive terminal of a voltage source, designated as V1, through a resistor 34 and is connected to ground through a resistor 35, the output terminal 31, and a resistor 36, the resistors 34–36 acting as a voltage-divider network. The emitter is connected to ground through a resistor 38. The base is connected to the input terminal 30 through a resistor 39 and is connected to ground through a blocking and clamping diode 40.

When a positive potential is applied to the input terminal 30, it is applied directly to the base of transistor 32 since the diode 40 blocks the flow of current through the resistor 39. As a result, transistor 32 is rendered conductive, since it is of the NPN type, so that current flows through the output circuit thereof. Current flowing through th output circuit of transistor 32 causes the potential at the collector to drop substantially instantaneously which in turn alters the voltage-dividing effect of resistors 34–36, since these resistors are connected between the collector and ground, so that the potential at the output terminal 31 drops proportionately. As may be seen, the voltage drop across resistors 35 and 36 is equal to the voltage drop across resistor 38 and the emitter-collector circuit of transistor 32. When a negative potential is provided at the input terminal 30, the diode 40 clamps the base of transistor 32 to ground, since current flows therethrough and through the resistor 39, so that the transistor is rendered nonconductive and the potential at the collector thereof is caused to rise substantially instantaneously toward the positive potential V1. In response to the rising collector voltage, the potential at the output terminal 31 also rises proportionately to a potential determined by the voltage-dividing effect of resistors 34–36. Thus, an essentially square wave output signal is produced at the output terminal 31 in response to the application of a sine wave input signal to the input terminal 30 by the synchronous signal source 11, the square wave output signal being the inverse of the sine wave input signal since the output is negative going when the input is positive going and vice versa (see FIG. 2).

If a clean square wave signal is produced by the synchronous signal source 11, there is no need for the amplifier-limiter circuit 18 and, accordingly, the amplifier-limiter circuit may then be omitted.

As mentioned above, the bistable device 14 has an input terminal corresponding to the output terminal 31 of the amplifier-limiter circuit 18 so that the bistable device is controlled by the output of the amplifier-limiter circuit. Additionally, the bistable device has an output terminal 43 which is connected to input terminals of the gates AND 1 and AND 2. The bistable device 14 is illustrated as a bistable magnetic flip-flop or multivibrator constructed in accordance with the principles of U.S.

Patent No. 2,897,380, issued July 28, 1959, to C. Neitzert. More specifically, the bistable device includes a saturable reactor 45 having an input winding 46, a triggering winding 47, a reset winding 48 and an output winding 49 wound on a core 50. Output pulses provided at the output terminal 43 are utilized in conjunction with output pulses provided by the oscillator 13 to control the operation of gates AND 1 and AND 2.

When saturation of the core 50 is exceeded in response to current flowing through the input winding 46, i.e., the saturable reactor is set, and the current is abruptly terminated, a voltage is induced in the triggering winding 47 which triggers a transistor 52, being illustrated as an NPN type transistor, so that current flows through the reset winding 48 and the core is driven back to the other state of saturation, i.e., the saturable reactor is reset. A damping resistor 53 is connected across the reset winding 48 and base current in the transistor 52 is limited by a series resistor 54. To improve the consistency of the square wave input signals applied to the input terminal 31 of the bistable device by the amplifier-limiter circuit, a transistor 55 is provided having its base or control terminal connected to the input terminal. Current flowing through the transistor 55 and the input winding 46 is limited by a series resistor 56 and the previously mentioned resistor 38, the transistor being rendered conductive when a positive-going input is applied to the input terminal and being rendered nonconductive when a negative-going input is applied to the input terminal since the transistor is of the NPN type.

In operation, assume that transistor 55 is conducting and the saturable reactor 45 is set. When the transistor 32 in the amplifier-limiter circuit 18 is rendered conductive, the potential at terminal 31 drops, i.e., a negative-going input is provided, and the transistor 55 in the bistable device is rendered nonconductive. Such operation takes place since, when transistor 32 conducts, it shorts out the base-emitter circuit of transistor 55 so that current flowing through the input winding 46 is aburptly terminated. The collapse of current flowing through the input winding 46 induces a voltage in the triggering winding 47 which renders the transistor 52 conductive so that current flows through the reset winding 48 causing the saturable reactor to be reset for another cycle of operation. During the time period when the saturable reactor is being reset, an output pulse is induced in the output winding 49 which is provided at the output terminal 43.

Subsequently, when the transistor 32 in the amplifier-limiter circuit is rendered nonconductive, the potential at terminal 31 rises, i.e., a positive-going input is provided, and the transistor 55 is rendered conductive so that current flows through the input winding 46 causing the saturable reactor to be set. In response to the saturable reactor being set, an output pulse is induced in the output winding 49 which is applied to the output terminal 43. Subsequently, when the transistor 55 is rendered nonconductive in response to the drop in potential at the input terminal 31, the cycle repeats itself. In the illustrated embodiment, it is assumed that in response to resetting of the saturable reactor, a positive-going output pulse is produced and in response to setting of the saturable reactor, a negative-going output pulse is produced, though the reactor may be so designed that the reverse operation occurs.

Thus, it may be seen that the bistable device 14 operates to produce output pulses at its output terminal in response to each transition of the input signal applied thereto, positive-going output pulses being produced in response to negative-going input signal transitions and negative-going output pulses being produced in response to positive-going input signal transitions.

The oscillator 13 is illustrated as a magnetic oscillator having feedback input terminals 60 and 61 and having an output terminal 63 connected to the gates AND 1 and AND 2. The magnetic oscillator includes a saturable transformer 65 having a pair of main windings 66 and 67 and an output winding 68, all wound about a core 70, the output winding being connected to input terminals of the gates AND 1 and AND 2 and being connected to the output terminal 12. Preferably, the core is formed of a readily saturable magnetic material having a generally rectangular hysteresis loop, such material being commercially sold by G. L. Electronics Company under the name "Orthonik" type P1040. For driving the core into its opposite conditions of saturation, which may for convenience be termed "positive" and "negative" saturation, the windings 66 and 67 are energized by transistors 71 and 72 having base or control circuits which are alternately energised by feedback or "cross" connections including resistors 73 and 74. Damping resistors 76 and 77 are shunted across the transformer windings 66 and 67 respectively. Since NPN transistors are utilized, positive potential is applied to the center terminal 78 of the transformer main windings 66 and 67 for feeding the collectors of the transistors 71 and 72, and the emitters of the transistors are connected to ground through a current-limiting resistor 79. A supply voltage, designated as V2, has its positive terminal connected to the transformer center terminal 78 and has its negative terminal connected to one of the feedback input terminals 60, the other feedback input terminal 61 being connected to ground.

In operation of the magnetic oscillator described above, application of the supply voltage causes both of the transistors to tend to conduct, but because of a slight inherent unbalance in the circuit, one transistor will normally tend to conduct more heavily than the other. Conduction in the predominating transistor induces a voltage in the associated transformer winding which is in such a direction as to forward bias the transistor so that the predominating transistor tends to conduct more heavily. In response to conduction of the predominating transistor, the potential at the collector thereof drops and, since the base of the other transistor is connected thereto through the "cross" connection, the other transistor is rendered nonconductive. When saturation of the core is reached, the rate of change of flux decreases; hence, by transformer action, the induced forward biasing voltage decreases and the current in the conducting transistor decreases so that the potential at the collector thereof rises. The rising collector potential turns on the former nonconducting transistor and conduction in this transistor induces a voltage in the associated transformer winding which is in such a direction as to forward bias this transistor so that this transistor tends to conduct more heavily. Conduction in the second transistor causes the potential at the collector thereof to drop so that the former conducting transistor is rendered nonconductive. The current flowing in the second transistor now drives the core to the opposite condition of saturation. This cycle is repeated at a rate which is directly proportional to the applied voltage and inversely proporitional to the saturation flux, the number of turns in the transformer winding, and the value of the resistance connected between the transistor emitters and ground.

Output pulses are induced in the output winding 68, as the core switches from one condition of saturation to the other condition of saturation and back again, and the output pulses constitute the output signal of the magnetic oscillator. Since the output winding 68 is connected to the output terminal 63, the output pulses are provided at the output terminal and are transmitted therefrom to the gates AND 1 and AND 2. The output signal provided by the illustrated magnetic oscillator as described above will be substantially a square wave signal.

The effective value of the supply voltage applied to the magnetic oscillator is determined by the summation of the voltage source V2 and the feedback voltage provided across the feedback input terminals 60 and 61. Since the time period required for the core to be driven from one state of saturation to the other state of saturation is dependent upon the voltage applied to the core windings, it follows that the frequency of the magnetic oscillator is dependent upon this voltage value and thus is dependent upon the amplitude of the feedback voltage provided across the feedback input terminals 60 and 61.

As previously set forth with respect to the operation of FIG. 1, positive output pulses are transmitted from the gates AND 1 and AND 2 in response to pulses of the same polarity from the bistable device and oscillator timingly overlapping. As may be seen by reference to FIG. 3, these output pulses are transmitted to an integrating network consisting of a capacitor 80, a charging resistor 81 and a discharging resistor 82. Accordingly, when an output pulse is transmitted from one of the gates AND 1 or AND 2, the capacitor 80 charges through the resistor 81 and, when the pulse is terminated, the capacitor discharges through resistor 82, the values of resistors 81 and 82 being so selected that the capacitor rapidly charges and slowly discharges. This, a slowly varying voltage is developed across the capacitor 80 having a substantially constant amplitude determined by the magnitude of the pulses transmitted through the gates and by the frequency at which such pulses are produced. The voltage thus maintained across capacitor 80 is the feedback voltage which is applied across the feedback input terminals 60 and 61.

From the foregoing, it may be seen that the output frequency of the magnetic oscillator is dependent upon (1) the duration of overlapping between output pulses from the bistable device and the oscillator, and (2) the frequency at which such overlapping occurs. Since the duration and frequency of overlap are directly related to the synchronous signal frequency, it follows that an output signal is provided at the output terminal 12 by the magnetic oscillator 13 having a frequency which is determined by the synchronous signal frequency and thus is a desired multiple of the synchronous signal frequency.

Though this embodiment of the invention has been described with a bistable magnetic control device 14, it is to be understood that the invention is not to be so limited, but rather is intended to cover the use of any comparable device for providing an output pulse during each cycle or half cycle of the synchronous signal. Additionally, the invention is intended to cover the use of any oscillator wherein the frequency may be varied in accordance with the varying amplitude of the supply voltage as determined by the feedback voltage amplitude.

Referring to FIG. 4, a second embodiment of a frequency multiplying synchronous oscillator is illustrated which also includes a synchronous signal source 111 which corresponds to the source 11 in FIG. 1. Likewise, the synchronous signal source is provided for producing a desired input signal having a frequency which is to be multiplied so that a desired output signal is provided at an output terminal 112. In accordance with the present invention, means are provided in this embodiment also for producing an output signal at the output terminal 112 which has a frequency that is maintained at an exact multiple of the synchronous signal frequency. More specifically, means are provided for regulating the output frequency of a high frequency oscillator 113, which has its output connected to the output terminal 112, in accordance with the frequency of the synchronous signal source so that an output signal having a desired frequency is provided thereby.

For this purpose, a monostable control device 114 is provided for producing an output pulse of a desired polarity and having a predetermined volt-second content in response to each cycle of the synchronous signal. Additionally, an integrator 115 is associated with the outputs of the monostable device 114 and the oscillator 113 and produces a control signal in response to output pulses of the same polarity from the monostable device and the oscillator timingly overlapping. i.e., portions of such pulses being concurrently produced. As with the previously described arrangement in FIG. 1, the control signal produced by the integrator 115 has an amplitude a feedback loop 116, which controls the output frequency of overlap. However, in this instance, the control signal is transmitted to a variable reactive element 117, over a feedback loop 116, which controls the output frequency of the oscillator. With this arrangement, the output frequency of the oscillator is determined by the instantaneous value of the reactive element which in turn is determined by the instantaneous amplitude of the control signal, the oscillator frequency being at the desired level when an equilibrium amplitude of the control signal is maintained.

For the purpose of controlling the operation of the integrator 115 in response to the simultaneous receipt of desired polarity pulses from the monostable device and the oscillator, a gate AND 3 is interposed between the integrator and both the monostable device and the oscillator. The gate has a pair of input terminals which are respectively connected to the output of the monostable device and the oscillator and has an output terminal connected to the integrator input so that the gate is opened and a pulse is transmitted therethrough to the integrator when pulses of a prescribed polarity are concurrently applied to the input terminals, i.e., the pulses timingly overlap. Since the time interval during which the gate is open is determined by the duration of overlap of the pulses, the time duration of the pulses applied to the integrator and thus the magnitude thereof are likewise determined thereby. The integrator 115 corresponds to the previously described integrator 15 (FIG. 1) and thus integrates pulses applied thereto so that a control signal is produced thereby having an amplitude determined by the magnitude of the pulses applied thereto and the frequency at which such pulses are provided.

In this instance, let it be assumed that the gate AND 3 is designed to cause a positive-polarity pulse to be applied to the integrator when a positive output pulse from the monostable device and a positive output pulse from the high frequency oscillator are concurrently produced.

For this embodiment also, an amplifier-limiter circuit 118 has been associated with the output of the synchronous signal source 111 for producing an essentially square wave ouput signal in response to the receipt of a sine wave input signal, this amplifier-limiter circuit corresponding to the previously described amplifier-limiter circuit 118 (FIG. 1). Accordingly, the amplifier-limiter circuit 118 may be omitted (1) if the synchronous signal source is designed to produce a square wave output, or (2) if the monostable device 114 is designed to respond to a sine wave signal.

As may be seen, a differentiator 120 has been interposed between the amplifier-limiter circuit 118 and the monostable device 114. Accordingly, spike-like input pulses will be applied to the monostable device in response to each transition of the output produced by the amplifier-limiter circuit. It is desirable to trigger the monstable device with spike-like input pulses so that the monstable device is free to return to the stable condition after the passage of a predetermined period of time and is not maintained in the nonstable state during an entire half cycle of the amplifier-limiter output signal. For example, if the output of the amplifier-limiter circuit were applied directly to the monostable device input, the monostable device would be driven to the nonstable state in response to the transition of the amplifier-limiter circuit output to a desired polarity and would be maintained in the nonstable state until the transition of the output signal to the opposite polarity. Under such conditions, an output would be provided by the monostable device which would have a time period longer than that desired.

An amplifier-limiter circuit 121 has also been interposed between the output of the high frequency oscillator 113 and the input of the gate AND 3. This amplifier-limiter circuit has been provided also to produce an essentially square wave output signal in response to the receipt of a sine wave input signal and thus is provided for those instances when a high frequency oscillator is utilized which produces a sine wave output. In the event a high frequency oscillator is utilized which provides a square wave output or in the event the gate AND 3 is responsive to sine wave signals, the amplifier-limiter circuit 121 may be omitted. In this connection, it is to be kept in mind that the invention is intended to cover the use of oscillators which provide sine wave or square wave outputs.

Figure 5:
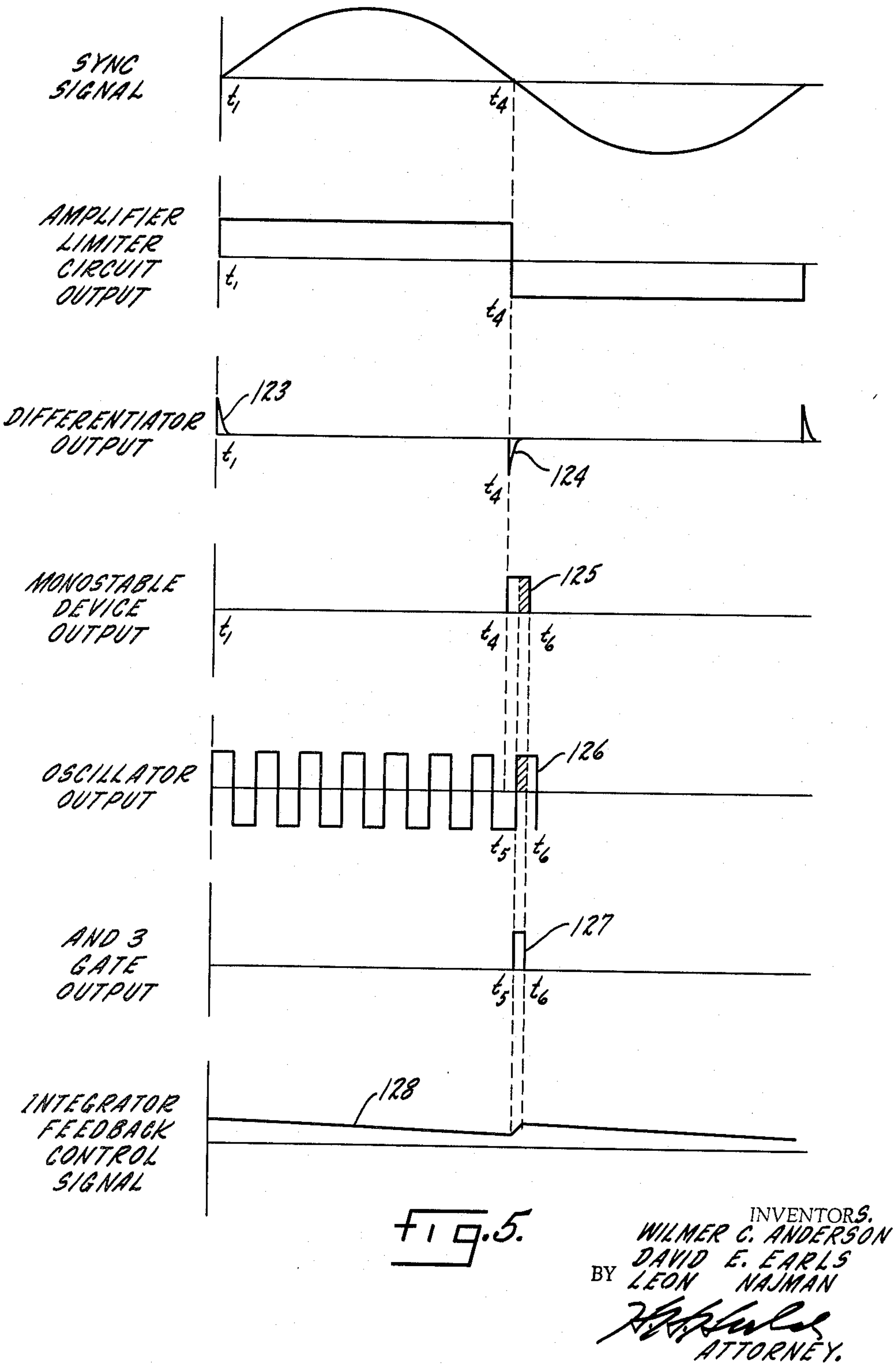
FIG. 5 shows wave forms at preselected points in the oscillator illustrated in FIG. 4.

A brief discussion of the operation of the frequency multiplier in FIG. 4 in conjunction with the graphs illustrated in FIG. 5 may be helpful in providing a better understanding of the operation of this embodiment of the present invention. Referring to FIG. 5, it may be seen that a sine wave output signal is produced by the synchronous signal source. For this embodiment, let it be assumed that the operation of the amplifier-limiter circuit 118 is opposite to that for the previously described amplifier-limiter circuit 18. Thus, a negative-going square wave signal is produced by the amplifier-limiter circuit 118 in response to each negative-going half cycle of the sine wave and, conversely, a positive-going square wave signal is produced in response to each positive-going half cycle of the sine wave signal. Accordingly, as may be seen in FIG. 5, the output of the amplifier-limiter circuit 118 is positive going at time $t_1$ and is negative going at time $t_4$. The differentiator 120 responds to the positive-going output at time $t_1$ to produce a positive-going spike-like pulse 123 and responds to the negative-going output at time $t_4$ to produce a negative-going spike-like pulse 124. The monostable device 114 in turn responds to the negative-going spike-like pulse 124 produced at time $t_4$ to produce a positive-going output pulse 125 from time $t_4$ to time $t_6$.

As may be seen, a continuously alternating pulse-type output is applied to the gate AND 3 by the oscillator 113 (in conjunction with the amplifier-limiter 121 when required) and, at time $t_5$, a positive-going pulse 126 is produced thereby so that from time $t_5$ to time $t_6$, positive-going outputs are concurrently provided by the monostable device and the oscillator. Accordingly, during this time period, the gate AND 3 is open and a positive pulse 127 is transmitted therethrough to the integrator 115. The integrator integrates the positive pulses applied thereto so that a control signal 128, such as that illustrated in FIG. 5 wherein it takes the form of a slowly varying D.-C. signal, is applied to the reactive element 117 to control the value thereof. As previously mentioned, the frequency of the oscillator is determined by the value of the reactive element and the value of the reactive element is determined by the amplitude of the control signal, the amplitude of the control signal being determined by the time duration and frequency at which pulses are applied to the integrator.

Again, it should be noted that when no change in overlapping occurs between output pulses from the monostable device and the oscillator, it indicates the oscillator frequency is a desired multiple of the synchronous signal frequency and a substantially constant feedback signal will be produced. Conversely, when a change in overlapping occurs, it indicates the oscillator frequency is not the desired multiple of the synchronous signal frequency and the amplitude of the feedback control signal will be changed to alter the oscillator frequency accordingly.

In this embodiment also, the time duration of the output pulses provided by the monostable device preferably correspond to the time duration for each half cycle of the oscillator so that the time duration of the pulses transmitted through the gate may vary between zero time duration and a maximum time duration corresponding to the time duration for each half cycle of the oscillator output, the actual time duration depending upon the duration of overlap.

Figure 6:
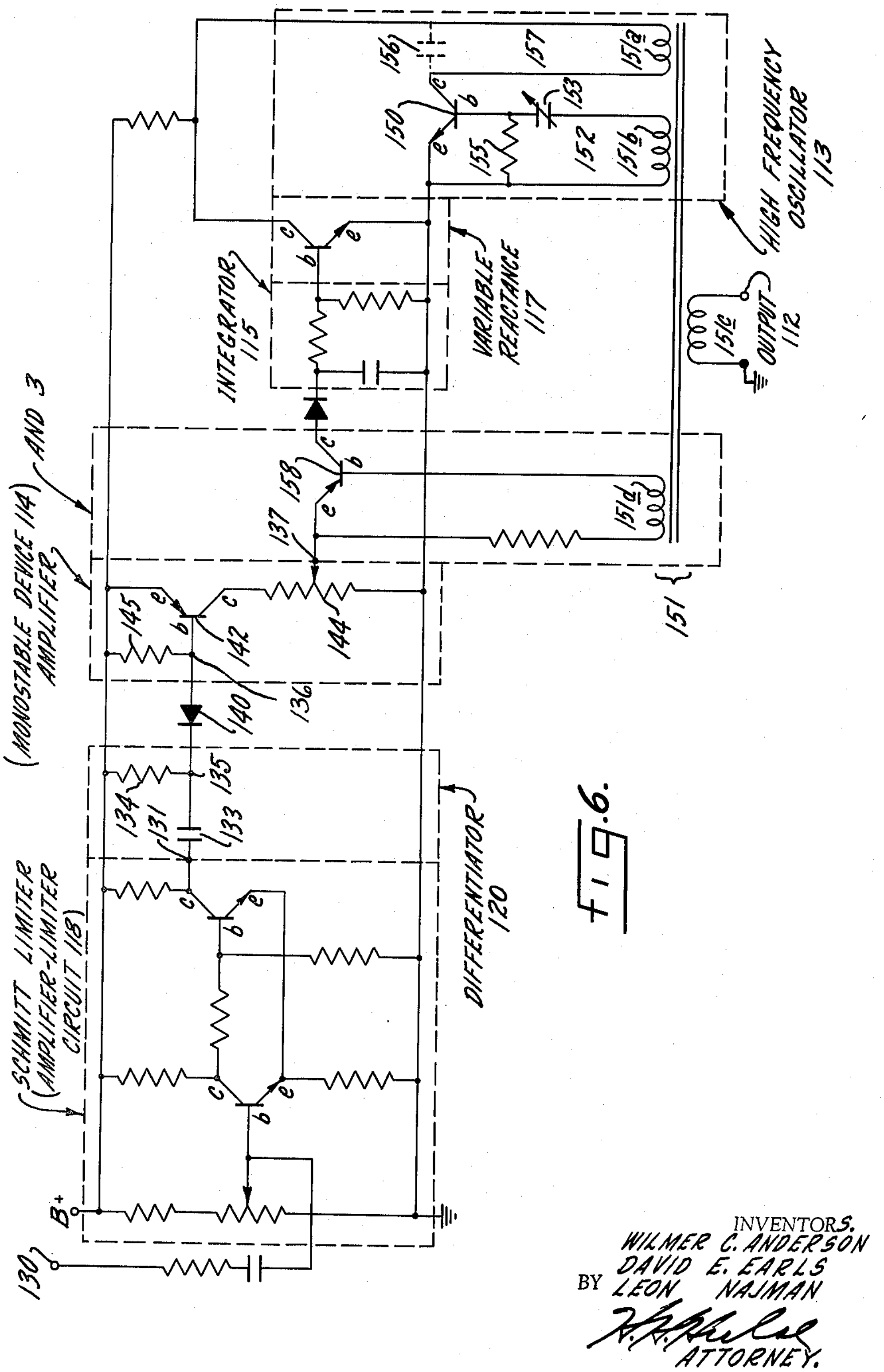
FIG. 6 is a schematic diagram of the frequency multiplying synchronous oscillator illustrated in block form in FIG. 4.

Referring to FIG. 6, a schematic diagram of a frequency multiplying synchronous oscillator corresponding to that illustrated in block form in FIG. 4 is illustrated. As may be seen, the amplifier-limiter circuit 118 in this embodiment has taken the form of a Schmitt trigger or limiter having an input terminal 130 to which the synchronous signal is applied and having an output terminal 131 corresponding to the input terminal of the differentiator 120. Since Schmitt triggers are well known in the art, the details of operation thereof will not be set forth. Suffice it to say that in response to each negative half cycle of the synchronous signal, a negative-going square wave is provided and, during each positive half cycle of the synchronous signal, a positive-going square wave is provided. For the details of the operation of a typical Schmitt trigger, reference may be made to page 208 of the Department of the Army Technical Manual TM 11–690 entitled "Basic Theory and Application of Transistors."

As may be seen, the differentiator 120 takes the form of a typical differentiator common to those skilled in the art and includes a capacitor 133 and a resistor 134. Briefly speaking, when a transistor occurs in the output of the Schmitt trigger, a corresponding output pulse is provided at the output terminal 135 of the differentiator. However, as the Schmitt trigger output remains at the same level subsequent to a transition, the capacitor 133 charges toward the Schmitt trigger output level so that the differentiator output decays to a reference or resting level. Accordingly, in response to each transition of the Schmitt trigger output, a corresponding spike-like output pulse is provided by the differentiator at the output terminal 135.

In the illustrated embodiment, the monostable device 114 has taken the form of a transistorized amplifier having an input terminal 136 and an output terminal 137. As may be seen, the input terminal 136 is connected to the differentiator output terminal through a blocking diode 140 and the output terminal 137 corresponds to the input terminal of the gate AND 3. The monostable device 114 includes a transistor 142 of the PNP type having its base connected to the input terminal 136, its emitter connected to a positive potential designated as B+, and having its collector connected to ground through a tapped resistor or potentiometer 144. Additionally, a control resistor 145 is connected between the emitter and the base of the transistor. When a positive-going output pulse is provided by the differentiator 120, the diode blocks the flow of current through the resistor 145 so that the transistor 142 is maintained in the nonconducting state. Conversely, when a negative-going output is provided by the differentiator, current flows through the resistor 145 and the diode 140 to the output terminal of the differentiator. As a result, the base of the transistor 142 is driven negative with respect to the emitter so that the transistor is rendered conductive and current is caused to flow through the tapped resistor 144. As a result, a positive-going output is provided at the output terminal 137 of the monostable device 114 and thus is applied to the gate AND 3.

The high frequency oscillator 113 is in the form of a tuned-base and tuned-collector oscillator. As may be seen, the oscillator includes a transistor 150 having a winding 151*a* of a feedback transformer 151 connected in series therewith and having a tank circuit 152 connected between the base and the emitter thereof. The tank circuit 152 includes a winding 151*b* of the transformer, a variable capacitor 153 which allows for manually tuning the oscillator through a range of frequencies, and a bias resistor 155. A capacitor 156 illustrated in phantom lines is representative of the inherent capacitance across the winding 151a which, with the winding 151a, forms another tank circuit 157. Power is supplied to the high frequency oscillator by the power source B+ and, as may readily be seen, the reactive element 117 is connected in parallel with the oscillator.

The reactive element 117 takes the form of a transistor having its collector-emitter circuit connected in parallel with the oscillator and having its base connected to the output of the integrator. As will be apparent to those skilled in the art, the emitter-collector capacitance of the transistor will vary with the amplitude of the signal applied to the base. Further, the emitter-collector capacitance of the transistor forms a part of the tank circuit 157 for the high frequency oscillator along with the winding 151a and the inherent capacitance 156 of the winding. Accordingly, the frequency of the oscillator 113 may be varied by varying the amplitude of the signal applied to the base of the transistor since the emitter-collector capacitance thereof will be altered thereby so that the tank circuit will likewise be altered.

The details of operation of the oscillator will not be set forth herein, though a brief discussion thereof may be helpful. Let it be assumed that the transistor 150 is initially in the cutoff state. The transistor will eventually be rendered conductive due to the oscillator parameters so that current will flow through the winding 151a. The amplitude of the current flow through the transistor will increase steadily in response to regenerative feedback due to the coupling between the winding 151a and the winding 151b, the voltage developed across the winding 151b being in a direction to render the transistor more conductive. A point will eventually be reached at which time the flow of current through the transistor can no longer be increased, i.e. the transistor is saturated. Since no further change in current flow through the winding 151a takes place, feedback ceases and the flow of current through the transistor will begin to decrease. In response to the decrease in current, a reverse feedback voltage is induced due to the regenerative action which causes the transistor to be rendered less conductive. Eventually a point is reached whereat the transistor again is in the cutoff state and the cycle will repeat itself. The rate at which the oscillator 113 cycles is determined by the tuned frequencies of the tank circuits 152 and 157 which are respectively dependent on the presetting of the capacitor 153 and the emitter-collector capacitance of the variable reactance transistor. An output winding 151c is also associated with the transformer and, accordingly, in response to the oscillation of the oscillator, a desired sine wave output will be induced therein. For the purpose of a more detailed description of the operation of such an oscillator, reference may be made to the material beginning on page 170 of the above-identified Department of the Army Technical Manual TM 11-690.

A winding 151d of the transformer 151 is connected between the base and the emitter of a transistor 158 which functions as the gate AND 3 and which is of the PNP type so that the transistor is rendered conductive when a voltage is induced in the winding which drives the base negative with respect to the emitter. Accordingly, when such a condition exists and the transistor 142 in the monostable device 114 is conductive so that a positive potential is produced at the output thereof, a positive pulse will be transmitted through the gate transistor 158 to the integrator 115. The integrator 115 is similar to the previously described integrator 15 in FIG. 1 and, accordingly, the details thereof will not be discussed. Suffice it to say that an output is produced thereby taking the form of a slowly varying D.-C. signal and having an amplitude corresponding to the average of the input applied thereto.

The output of the integrator 115 is in turn applied to the base of the reactive element transistor and the collector-emitter capacitance thereof is determined by the output signal amplitude of the integrator. Since a change in the collector-emitter capacitance will vary the tank circuit 157 of the oscillator, which in turn will vary the frequency of the oscillator 113, it is apparent that the oscillator frequency is dependent upon the amplitude of the integrator output. As previously set forth, the integrator output amplitude is determined by the period and rate of overlap of pulses applied to the gate AND 3 by the oscillator and the monostable device.

With the circuit arrangements as described hereinabove, it has been found that a frequency multiplication on the order of 500:1 may be reliably and accurately obtained. Additionally, it has been found that the multiplication ratio may be increased, if desired, to a ratio on the order of 1000:1. One reason for this capability is the fact that the outputs of the control devices 14 and 114 are effective during only one cycle of the oscillator output out of a much greater number of cycles. For example, with a 100:1 multiplication ratio, one output pulse from the bistable device 14 would occur each fifty cycles of the oscillator output and one output pulse from the monostable device 114 would occur every one hundred cycles of the oscillator output. Under such circumstances, the bistable device would be effective only for one cycle out of every fifty cycles and the monostable device for one cycle out of every one hundred cycles.

It will be appreciated that the present frequency multiplying synchronous oscillators not only enable large multiplication ratios to be achieved, but also attain the result using a minimum number of readily available components. Additionally, the circuits are susceptible to extreme miniaturization; this, combined with low average current drain, makes the devices useful as building blocks in larger circuit assemblies employed in remote locations where reliability, long life and low current drain are essential.

We claim as our invention:

In a frequency multiplying synchronous oscillator, the combination which comprises:

a variable magnetic oscillator for providing an output signal having an instantaneous frequency determined by the amplitude of a control signal applied thereto;

an alternating synchronous signal source;

a bi-stable magnetic device for producing alternating polarity square wave output pulses having predetermined time durations in response to succeeding half cycles of the synchronous signal;

first coincident means having a plurality of inputs, one input of which is coupled to the output of said bi-stable magnetic device and the other input of which is coupled to the output of said variable magnetic oscillator, for providing a first square wave control pulse in response to coincidence of positive polarity input signals applied thereto, said control pulse having an amplitude determined by the duration of coincidence and the frequency of coincidence;

and second coincidence means having a plurality of inputs, one input of which is coupled to the output of said bi-stable magnetic device and the other input of which is coupled to the output of said variable magnetic oscillator, for providing a second square wave control pulse of the same polarity of the first control pulse in response to coincidence of negative polarity input signals applied thereto, said control pulse having an amplitude determined by the duration of coincidence and the frequency of coincidence; and integrating means, for receiving each of said control pulses, and applying a control signal in response thereto to the oscillator, said control signal having an amplitude determined by the frequency at which the control pulses are provided and the magnitude of such control pulses, so that the oscillator output signal has a frequency that is a desired multiple of the synchronous signal frequency.

(References on following page)

References Cited by the Examiner

UNITED STATES PATENTS

| | | | |
|---|---|---|---|
| 2,521,058 | 9/1950 | Goldberg | 331—27 |
| 2,617,040 | 11/1952 | Bailey | 331—28 |
| 2,748,191 | 5/1956 | Sonnenfeldt | 331—20 |
| 2,773,188 | 12/1956 | Hugenholtz | 331—19 |
| 2,870,330 | 1/1959 | Salmet | 331—19 |
| 2,892,945 | 6/1959 | Ule | 331—18 |
| 2,930,001 | 3/1960 | Salmet | 331—19 |
| 3,005,165 | 10/1961 | Lenigan | 331—11 |

OTHER REFERENCES

E. H. Hugenholtz, Philips Technical Review, "The Impulse-Governed Oscillator, a System for Frequency Stabilization," November 1952, vol. 14, No. 5, pp. 130–140.

ROY LAKE, *Primary Examiner.*

JOHN KOMINSKI, *Examiner.*